United States Patent
Gohara

(10) Patent No.: US 7,576,325 B2
(45) Date of Patent: Aug. 18, 2009

(54) ELECTRON MICROSCOPIC METHOD AND ELECTRON MICROSCOPE USING SAME

(75) Inventor: Kazutoshi Gohara, Sapporo (JP)

(73) Assignee: National University Corporation Hokkaido University, Hokkaido (JP)

( * ) Notice: Subject to any disclaimer, the term of this patent is extended or adjusted under 35 U.S.C. 154(b) by 471 days.

(21) Appl. No.: 11/596,991

(22) PCT Filed: May 20, 2005

(86) PCT No.: PCT/JP2005/009228
§ 371 (c)(1),
(2), (4) Date: Nov. 20, 2006

(87) PCT Pub. No.: WO2005/114693
PCT Pub. Date: Dec. 1, 2005

(65) Prior Publication Data
US 2008/0197281 A1    Aug. 21, 2008

(30) Foreign Application Priority Data
May 20, 2004    (JP)    ............................. 2004-150588

(51) Int. Cl.
*G01N 23/00*    (2006.01)

(52) U.S. Cl. ........................ 250/311; 250/306; 250/307; 250/310; 250/397

(58) Field of Classification Search ................ 250/306, 250/307, 310, 311, 397
See application file for complete search history.

(56) References Cited

U.S. PATENT DOCUMENTS

2004/0061053 A1*    4/2004    Taniguchi et al. ........... 250/310

FOREIGN PATENT DOCUMENTS

| | | |
|---|---|---|
| JP | 01-204342 A | 8/1989 |
| JP | 07-282763 A | 10/1995 |
| JP | 10-268503 A | 10/1998 |

OTHER PUBLICATIONS

R.W. Gerchnerg and W.O. Saxton, "A practical algorithm for the determination of phase from image and diffraction plane pictures", *Optik* (Stuttgart), vol. 35, pp. 237-246, 1972.

(Continued)

*Primary Examiner*—Jack I Berman
*Assistant Examiner*—Hanway Chang
(74) *Attorney, Agent, or Firm*—The Nath Law Group; Jerald L. Meyer; Derek Richmond

(57) ABSTRACT

There is provided an electron microscopic method capable of realizing a high resolution based on the principle of the phase retrieval method. An electron microscope (10) using the method is a device dedicated to the phase retrieval method in which hardware (incident system (100), a sample system (200), a detection system (300), a computer system (400)) and software (constriction condition, optimization method) are formed into a unitary block. The intensity distribution and the phase distribution of the support slit (210) are given as a real space constriction condition. The detection system (300) includes a course system having an objective lens (310) and a course detector (320) and a fine system has a fine detector (330). The course image is acquired by electrically turning on the objective lens. After acquiring the diffraction pattern by electrically turning off the objective lens, the fine image is reconfigured by the phase retrieval method using the obtained course image and diffraction pattern.

31 Claims, 12 Drawing Sheets

OTHER PUBLICATIONS

J.M. Zuo et al., "Atomic Resolution Imaging of a Carbon Nanotube from Diffraction Intensities", *Science*, vol. 300, pp. 1419-1421, 2003.

J.R. Fienup, "Phase retrieval algorithms: a comparison", *Applied Optics*, vol. 21, pp. 2758-2769, 1982.

* cited by examiner

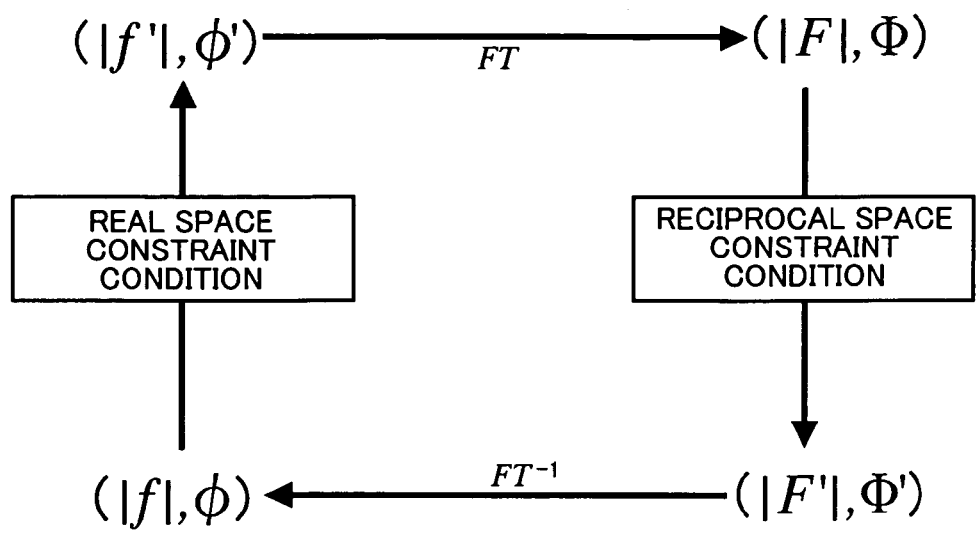
FIG. 4
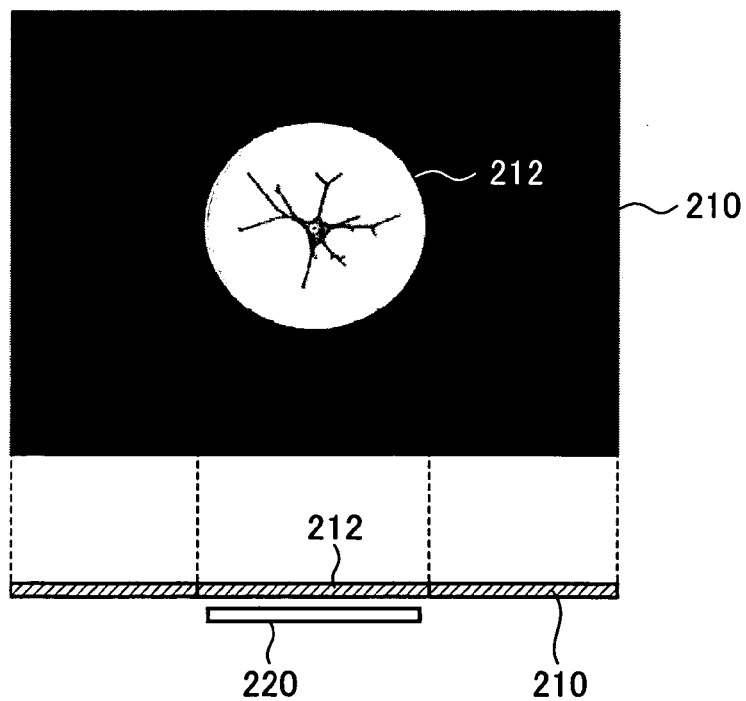
FIG. 5A
FIG. 5B

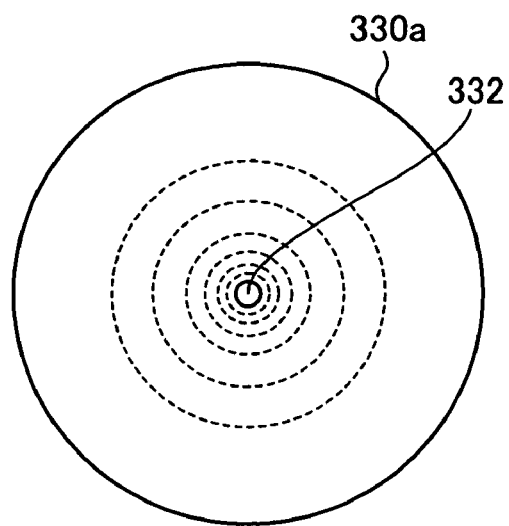
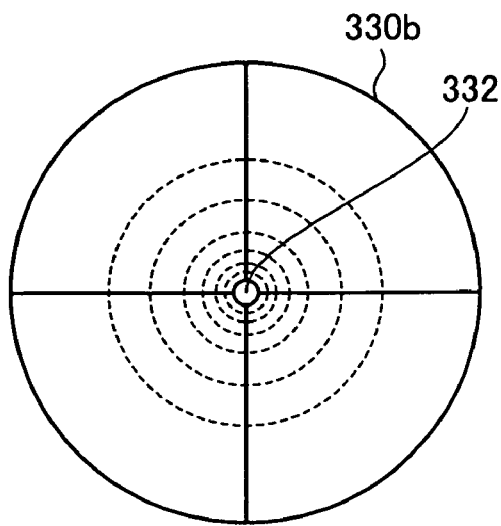
FIG. 8A    FIG. 8B
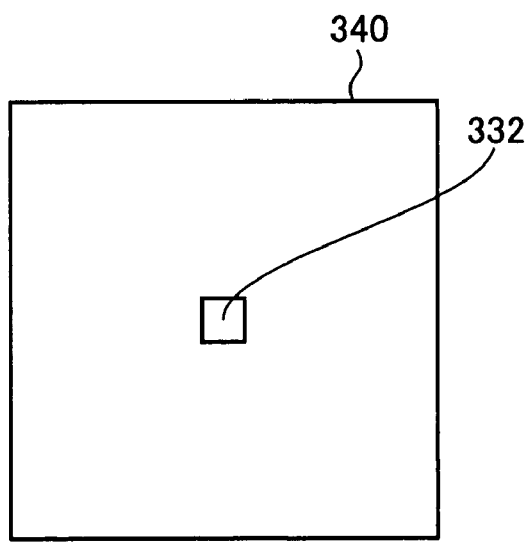
FIG. 9

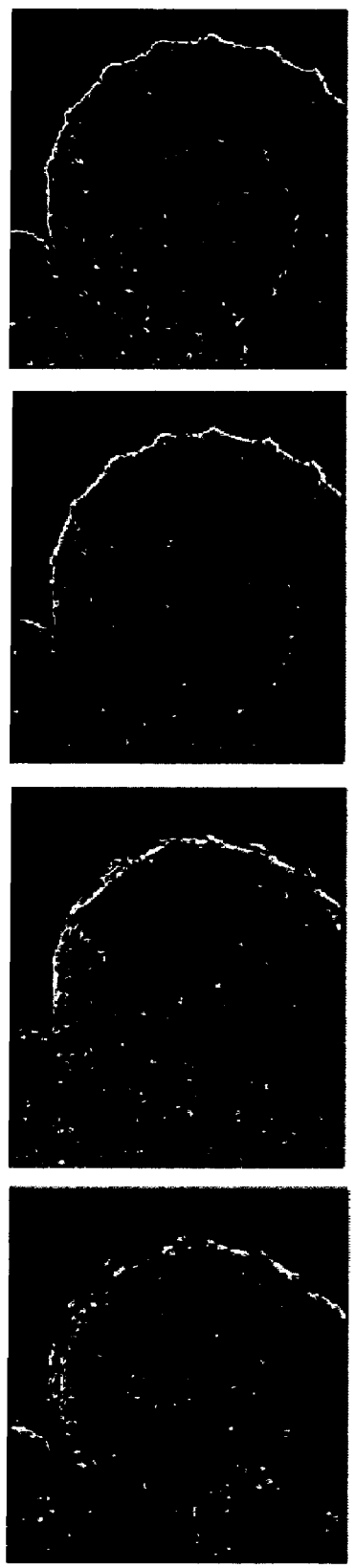

ELECTRON MICROSCOPIC METHOD AND ELECTRON MICROSCOPE USING SAME

TECHNICAL FIELD

The present invention relates to an electron microscopic method and electron microscope using this method, and, more particularly, relates to a method for implementing high resolution in an electron microscope.

BACKGROUND ART

A method of obtaining a real image of an object by making plane waves enter the object and repeatedly carrying out Fourier transform in real space and reciprocal space based on diffracted images from the object is referred to as the "Fourier iterative phase retrieval method" or simply "phase retrieval method" (referred to here as "phase retrieval method"), and it is well-known that spatial resolution of a wavelength order of an incident wave can be obtained in principle (Non-Patent Document 1).

FIG. 1 schematically shows diffraction phenomena. First, source (source of incident waves) 1, sample 3 and detector 5 are arranged as shown in FIG. 1. In this state, waves outputted from source 1 enters sample 3 and scatters, and are recorded by detector 5. At this time, information recorded in detector 5 is generally the intensity of diffracted waves, and amplitude can be obtained from this information, but phase of the diffracted waves cannot be obtained. If phase is obtained, information (images) of the object can be obtained by Fourier transform of the diffracted waves. It is well-known that phase can be obtained by the phase retrieval method by adding certain constraint conditions, and as described above, spatial resolution of a wavelength order of the incident waves can be obtained in principle.

Therefore, when the phase retrieval method is applied to an electron microscope, spatial resolution of an electron de Broglie wavelength decided by an accelerating voltage is expected.

Non-Patent Document 2 reports the success of the observation of nanotubes using a field-emission transmission electron microscopy (Made by JEOL: JE0L2010F), and achievement of spatial resolution of one Angstrom that is less than 2.2 Angstroms guaranteed by the apparatus.

Non-Patent Document 1: R. W. Gerchberg and W. O. Saxton, "A practical algorithm for the determination of phase from image and diffraction plane pictures", Optik (Stuttgart), vol. 35, pp. 237-246, 1972

Non-Patent Document 2: J. M. Zuo et al., "Atomic Resolution Image of a Carbon Nanotube from Diffraction Intensities", SCIENCE, vol. 300, pp. 1419-1421, 2003

DISCLOSURE OF INVENTION

Problems to be Solved by the Invention

However, the report of applying phase retrieval method in Non-Patent Document 2 to electron microscopes is a verification experiment of the principle, and there is still a difference of forty times from the de Broglie wavelength expected from the accelerating voltages. Namely, though the de Broglie wavelength of an accelerating voltage of 200 kV is 0.025 Angstroms, the reported resolution is one Angstrom.

This limitation is mainly caused by using the existing apparatus as is. The existing apparatus uses an objective lens and acquires a real image and a diffraction pattern. Therefore, in addition to the real image, a diffraction pattern that is also subject to the influence of lens aberrations (lens imperfections) is used in phase retrieval, and there is no case where an ideal aplanatic diffraction pattern is used in an electron microscope. This is because the existing electron microscope apparatus is designed on the premise that the diffraction pattern is acquired on the back focal plane of the objective lens. It is also necessary to provide a dedicated apparatus adopting the principle of the phase retrieval method in order to implement high resolution at the electron microscope.

It is therefore an object of the present invention to provide an electron microscope method that is capable of implementing high resolution according to the principle of the phase retrieval method, and an electron microscope employing this method.

Means for Solving the Problem

The present invention is an electron microscope method that irradiates a sample with an electron beam, measures intensity of a diffracted wave from the sample, and reconstructs an image of an object using the phase retrieval method based on measured intensity of the diffracted wave, the electron microscope method having the step of acquiring a coarse image of comparatively low spatial resolution using a physical objective lens and the step of acquiring a fine image of higher spatial resolution by the phase retrieval method using the intensity of the diffracted wave that is not subject to influences of an imperfect objective lens without using the physical objective lens.

It is preferable that the physical objective lens is an objective lens capable of being turned on and off electrically. In this case, in the step of acquiring the coarse image, the objective lens is turned on electrically and a coarse image is acquired, and, in the step of acquiring the fine image, the objective lens is turned off electrically and the diffraction pattern can be acquired from the same region as the coarse image. Further, in the step of acquiring the fine image, a fine image can be reconstructed by the phase retrieval method using the respectively acquired coarse image and diffraction pattern. It is preferable to use the coarse image as an initial image in the phase retrieval method. Using the coarse image as the initial image corresponds to using a phase as an initial constraint condition in reciprocal space by carrying out Fourier transform.

Further, the present invention is also an electron microscope that irradiates a sample with an electron beam, measures intensity of a diffracted wave from the sample, and reconstructs an image of an object using the phase retrieval method based on measured intensity of the diffracted wave, the electron microscope having a section that acquires a coarse image of a comparatively low spatial resolution using a physical objective lens, and a section that acquires a fine image of a higher spatial resolution by the phase retrieval method using the intensity of the diffracted waves, without using the physical objective lens.

ADVANTAGEOUS EFFECT OF THE INVENTION

According to the present invention, it is possible to obtain an electron microscope method that is capable of implementing high resolution according to the principle of the phase retrieval method, and electron microscope employing this method.

BRIEF DESCRIPTION OF THE DRAWINGS

FIG. 4 shows variables used in the phase retrieval method and the relationships thereof;

FIG. 5A shows a configuration of a sample system seen from an irradiation direction of an electron beam;

FIG. 5B shows a configuration of a sample system seen from a direction perpendicular to the irradiation direction of the electron beam;

FIG. 8A shows an example of an integrated-type spherical fine detector;

FIG. 8B shows an example of a split spherical fine detector;

FIG. 9 shows an example of a planate fine detector;

FIG. 15A shows an example of a real image with a repeat count of 10;

FIG. 15B shows an example of a real image with a repeat count of 100;

FIG. 15C shows a real image with a repeat count of 1000; and

FIG. 15D shows an example of a real image with a repeat count of 5000.

BEST MODE FOR CARRYING OUT THE INVENTION

Embodiments of the present invention will be explained below in detail with reference to the accompanying drawings.

The present inventor reexamines the principle of the phase retrieval method, finds the specific configuration method and components for the electron microscope required from this principle, and devises a dedicated apparatus for the electron microscope specialized in the phase retrieval method and provided with these.

Figure 1:
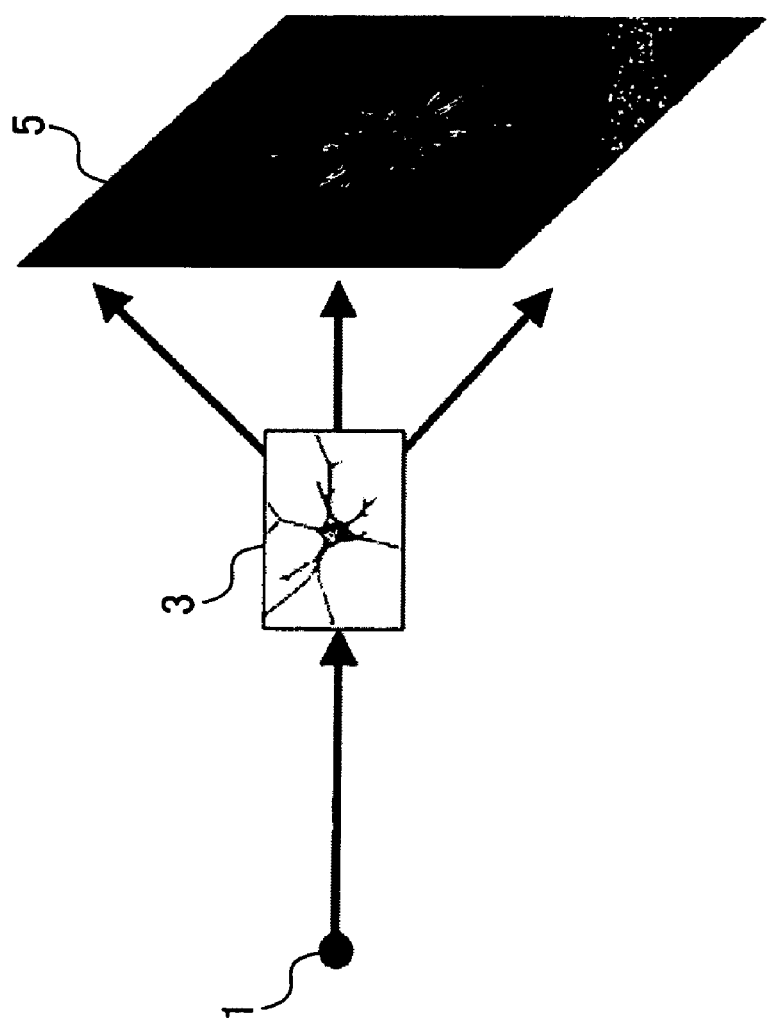
FIG. 1 schematically shows diffraction phenomena.
Figure 2:
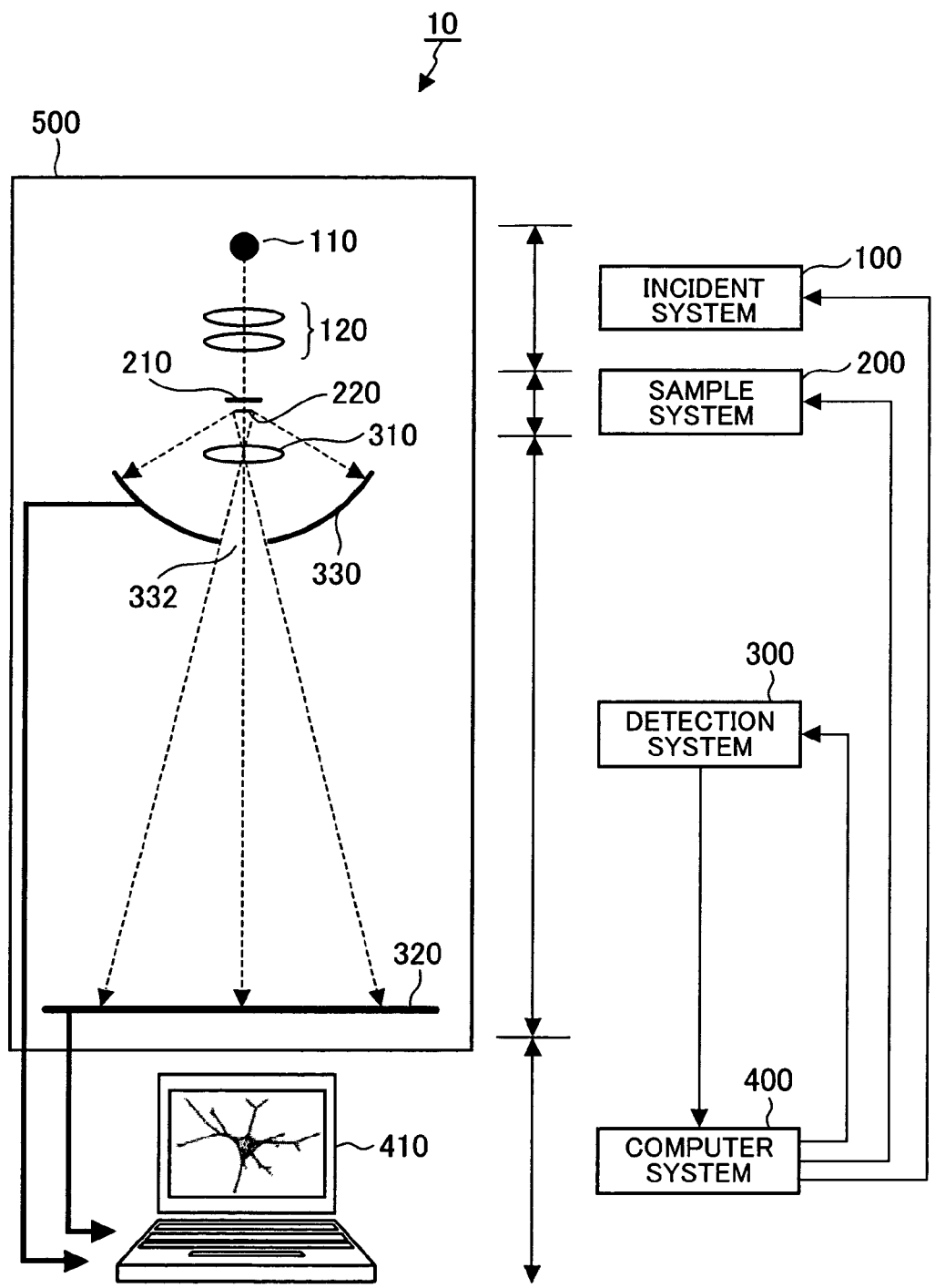
FIG. 2 is a block diagram showing a hardware configuration of an electron microscope according to one embodiment of the present invention.

FIG. 2 is a block diagram showing a configuration of the electron microscope according to one embodiment of the present invention. Generally, reconstruction of a real image mainly requires hardware and software, but FIG. 2 shows only hardware for the electron microscope.

The hardware for electron microscope 10 shown in FIG. 2 may be roughly classified into incident system 100, sample system 200, detection system 300 and computer system 400. Incident system 100, sample system 200 and detection system 300 are housed within vacuum case 500.

Incident system 100 has a function for irradiating a sample with a parallel electron beam, and has electron source 110 that generates an electron beam and parallel irradiation lens system 120. Parallel irradiation lens system 120 is configured with an electromagnetic lens. The electron beam generated by electron source 110 is made into a parallel electron beam by parallel irradiation lens system 120, and irradiates sample system 200.

Sample system 200 has a function for fixing the sample and a function for controlling the environment of the sample, and has support slit 210 and sample 220. As described later, it is possible to add "phase" as a constraint condition in real space using support slit 210. Namely, intensity distribution and phase distribution of support slit 210 are added as constraint conditions in real space in the phase retrieval method. Sample 220 is mounted on a sample table (not shown).

Here, "support" refers to a region including the sample (observation region). Further, "support slit" configures two regions, a region including the sample and the other region. The former is the image to be targeted (image obtained by the phase retrieval method) and the latter is a region where amplitude is made zero as a constraint condition in real space.

Detection system 300 has a function for measuring intensity of diffracted waves from the sample, and has objective lens 310, coarse detector 320 and fine detector 330. Namely, in this embodiment, detection system 300 is provided with two systems, a coarse system and a fine system. Here, the coarse system is a detection system for obtaining an image of a comparatively low spatial resolution by physical objective lens (an objective lens capable of being turned on and off electrically) 310. The fine system is a detection system for obtaining high spatial resolution by the phase retrieval method using intensity of diffracted waves. Objective lens 310 and coarse detector 320 are included in the coarse system, and fine detector 330 is included in the fine system. As described later, by providing both the coarse system and the fine system, it is possible to use an image in real space of low resolution obtained at the coarse system as phase retrieval constraint conditions for the fine system, so that a high-resolution image can be obtained. Objective lens 310 is configured with a magnetic lens. In FIG. 2, a magnifying lens system such as an intermediate lens and photographing lens is omitted. Further, depending on the configuration, it is possible to combine the coarse detector and the fine detector to be shared.

Computer system 400 has a function for reconstructing images of an object using the phase retrieval method based on the intensity of diffracted waves measured by detection system 300 and is configured with computer 410. Coarse detector 320 and fine detector 330 of detection system 300 are respectively connected to computer 410. Further, as described later, processing results of computer system 400 are fed-back to incident system 100, sample system 200 and detection system 300.

Figure 3:
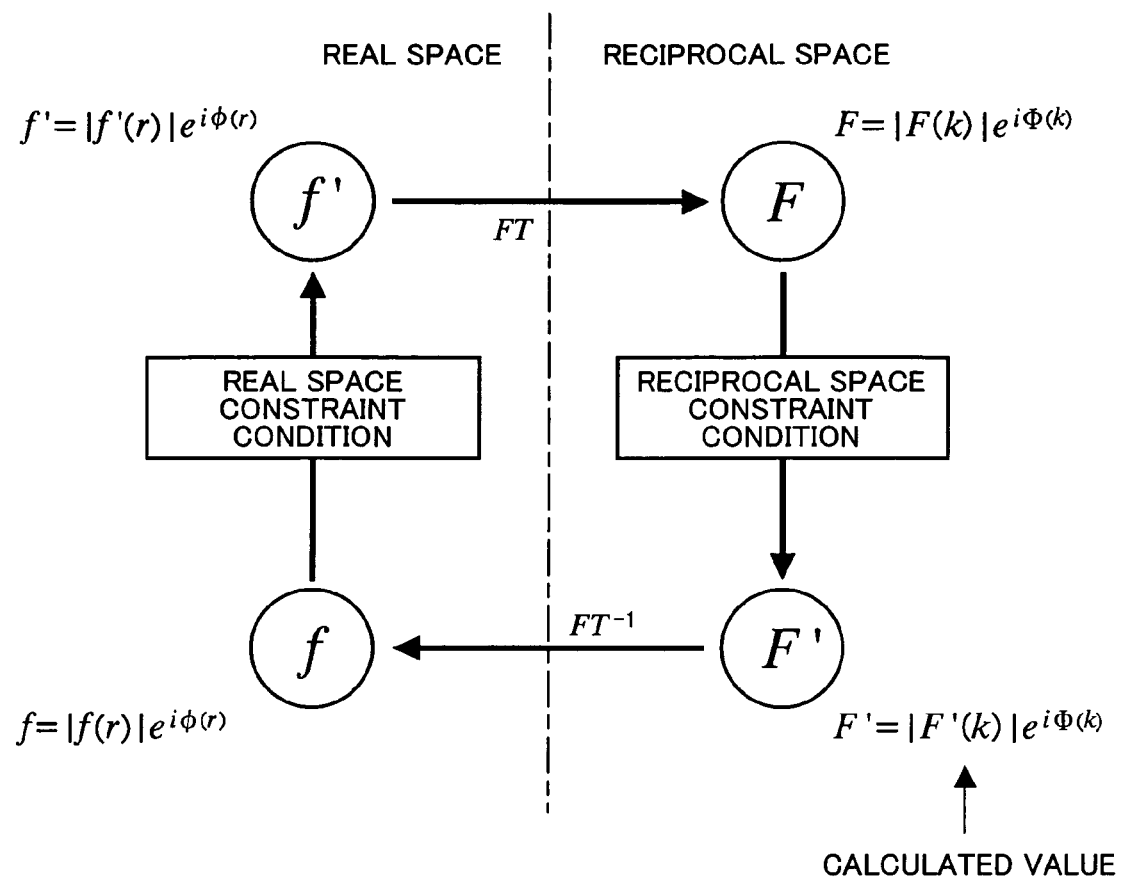
FIG. 3 shows the principle of the phase retrieval method.

FIG. 3 shows the principle of the phase retrieval method. In FIG. 3, f indicates object waves in which incident waves and the object are mutually interacted, and, when f appropriately assumed as an initial condition is Fourier transformed, diffracted wave F on the detection surface can be obtained. Amplitude of diffracted wave F can be obtained through experiment, and therefore is replaced with a measurement value through the experiment (reciprocal space constraint conditions) and assumed as F'. Object wave f is then obtained by subjecting F' to inverse Fourier transform. This wave to which appropriate real space constraint condition is added is again assumed as f'. Information (images) about the real object is obtained by repeating this process. Namely, in the phase retrieval method, repeated calculation that repeats Fourier transforms and inverse Fourier transforms under appropriate restraint conditions is used. In the above, refer to J. R. Fienup, "Phase retrieval algorithms: a comparison", Appl. Opt., vol. 21, pp. 2758-2769, 1982.

In this embodiment, the phase retrieval method is organized using original observation points, and new constraint conditions that had not been considered up to now are used. FIG. 4 shows the extracted relationship of variables used in the phase retrieval method and variables that can be modified according to constraint conditions. In the expressive form of the polar coordinates, $(|f|, \phi)$ indicates amplitude and phase in real space, and the addition of real space constraint conditions to this is assumed as $(|f'|, \phi')$. The waves subjected to Fourier transform on this is the diffracted wave, and its amplitude and phase is assumed as (|F|, Φ), and the addition of reciprocal space constraint conditions to this is (|F'|, Φ). When subjected to Fourier transform, this becomes (|f|, φ) for real space. Conventionally, only amplitudes |f| and |F| are considered in both real space and reciprocal space for the constraint conditions. In the present invention, phases φ and Φ are also added directly to the constraint conditions. As a result, it is possible to approach a superior optimal solution more rapidly, and improve spatial resolution.

For example, by arranging support slit 210 at sample system 200, it is possible to add new real space constraint conditions for the phase of real space.

In the phase retrieval method, it is known that, when amplitude around the sample is zero is used as one of the real space constraint conditions, it is possible to improve convergence of the reconstructed image. The present inventor therefore finds that, if a region with amplitude of zero is always formed on the outside of the region of observation of the intended sample, it is possible to add fixed constraint conditions without taking the size and shape of the sample into consideration. As a result, in this embodiment, support slit 210 is arranged at sample system 200.

As described later, it is also possible to add new real space constraint conditions using a coarse image obtained at the coarse system as an initial image in the phase retrieval method.

FIG. 5 shows a configuration of sample system 200, where FIG. 5A is a view as seen from the irradiation direction of an electron beam, and FIG. 5B is a view as seen from a direction perpendicular to the irradiation direction of the electron beam. As shown in FIG. 5, support slit 210 is arranged to the front of sample 220 with respect to the irradiation direction of the electron beam and has hole 212 formed in the center. As a result, it is possible to add the following constraint conditions with respect to the amplitude.

Amplitude: $|f(x)|=0$ (regions outside the hole)  (1)

Further, it is possible to add the following constraint conditions with respect to the phase.

Phase: $\phi=\phi(x)$ (regions outside the hole)  (2)

Here, φ(x) is phase distribution with respect to the region outside of hole 212 obtained from phase retrieval based on a diffraction image for just slit 210 with no sample 220. In this embodiment, φ(x) is used as an approximation for phase distribution when sample 220 is arranged at the same time as slit 210. φ(x) is obtained in advance before sample 220 is arranged.

As another example of adding the phase to the constraint conditions, an example can be given where the phase for outside of the sample is the same (constant).

Figure 6:
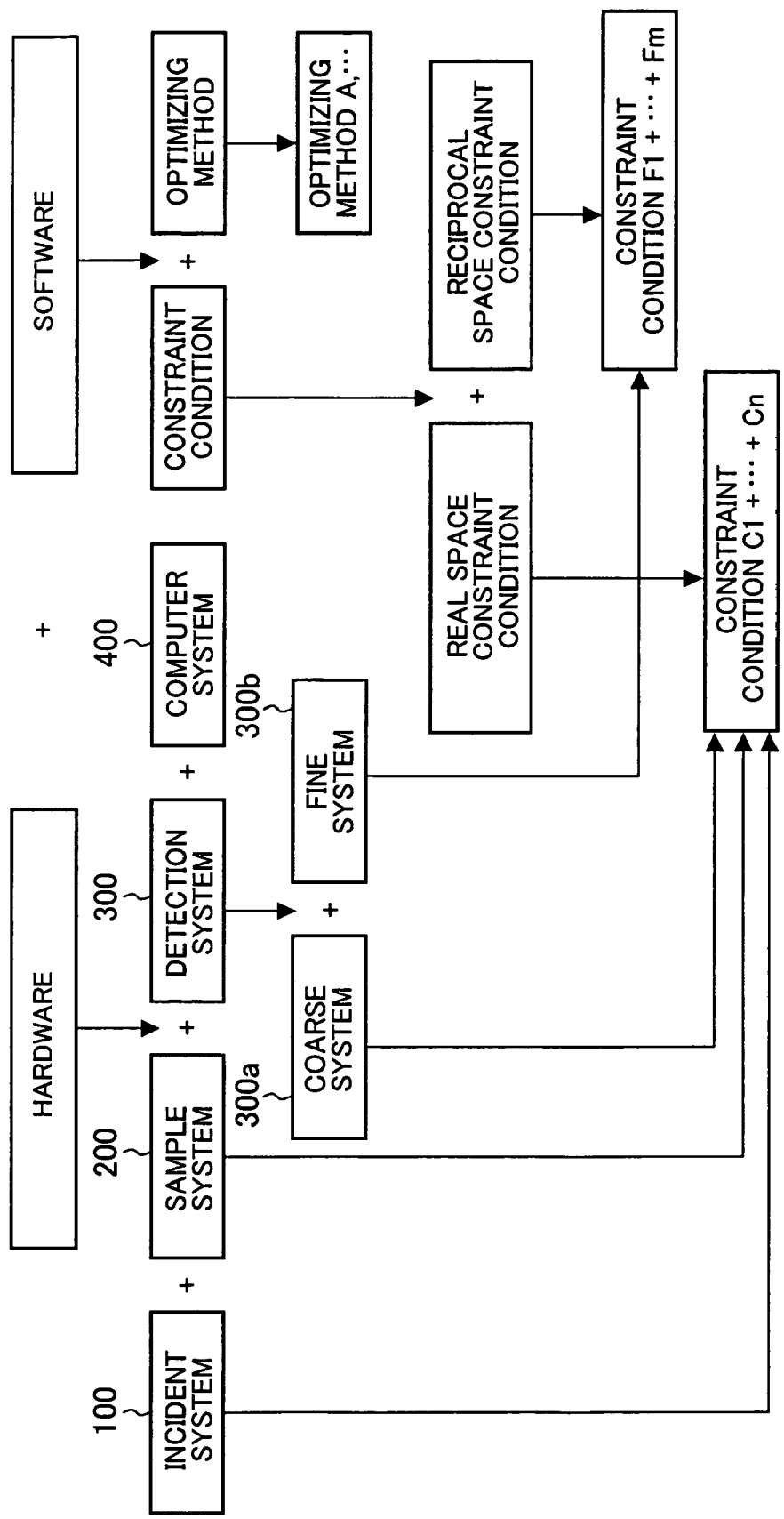
FIG. 6 is a block diagram showing basic components of the electron microscope of FIG. 2 and the relationship thereof.

FIG. 6 is a block diagram showing basic components of electron microscope 10 shown in FIG. 2 and the relationship thereof. As described above, reconstruction of a real image at electron microscope 10 mainly requires hardware and software. As described above, the hardware is configured with incident system 100, sample system 200, detection system 300 and computer system 400, and the software is divided into constraint conditions and optimization methods. Detection system 300 is provided with two systems, coarse system 300a and fine system 300b. As described above, the coarse system 300a includes objective lens 310 and coarse detector 320, and fine system 300b includes fine detector 330.

The software can be regarded as an algorithm for problems of non-linear optimization with constraint conditions, and can apply different optimization methods. The applicable optimization methods include, for example, gradient methods, conjugate gradient methods, Newton's method, quasi Newton's method, MEM (Maximum Entropy Method) and genetic algorithms.

For example, in gradient methods, error E in reciprocal spaces is defined as follows.

$$E=(|F(\Phi)|-|F'|)^2 \quad (3)$$

Further, in FIG. 4, phases for the tth time and the (t+1)th time are $\Phi_t$ and $\Phi_{t+1}$, respectively. An update rule for phase Φ is defined as follows using differential (gradient) ∇E for an error with respect to phase Φ of a tth time.

$$\Phi_{t+1}=\Phi_t-\eta \nabla E \quad (4)$$

At this time, by appropriately deciding η (for example, setting this to be sufficiently small, as an example), it is possible to obtain phase Φ providing a minimum value for error E.

Further, it is possible to divide constraint conditions into real space constraint conditions and reciprocal space constraint conditions. Conventionally, real space constraint conditions mainly have conditions that amplitude of the sample is larger than zero, and amplitude around the sample is zero. The reciprocal space constraint conditions require the amplitude obtained from the intensity of the diffracted waves measured at the detection system as a condition, and the hardware and software are linked only by the amplitude obtained from the intensity of the diffracted waves. However, this embodiment, as shown in FIG. 6, further increases the degree of linking of the hardware and software, and adopts a configuration where the software constraint conditions can be decided using the hardware.

In this embodiment, as described above, detection system 300 is provided with two systems of coarse system 300a and fine system 300b. As a result, it is possible to use an image in real space of low resolution obtained by coarse system 300a as a constraint condition for phase retrieval of fine system 300b. Further, as shown in FIG. 6, data for fine system 300b becomes m reciprocal space constraint conditions (F1, F2, . . . , Fm), and n real space constraint conditions can be added from incident system 100 and coarse system 300a in addition to from sample system 200. As a result, it is possible to add a larger number of constraint conditions, and improve convergence speed of the reconstructed image and the finally obtained spatial resolution.

Further, this embodiment, as shown in FIG. 2, adopts a configuration where processing results (final output results, that is, phase retrieval calculation results) of computer system 400 are fed back electrically into the whole apparatus (incident system 100, sample system 200 and detection system 300). Specifically, the operation target of feedback is as follows. For example, at incident system 100, the acceleration voltage/current (de Broglie wavelength) of electron source 110 and a degree of parallelization of parallel irradiation lens system 120, and, at sample system 200, the position of support slit 210 and the position of sample 220, and, at detection system 300, the magnification and aperture of objective lens 310. The specific content of feedback control will be described later together with a description of the operation of electron microscope 10 in FIG. 2.

Next, detectors 320 and 330 will be described.

Figure 7:
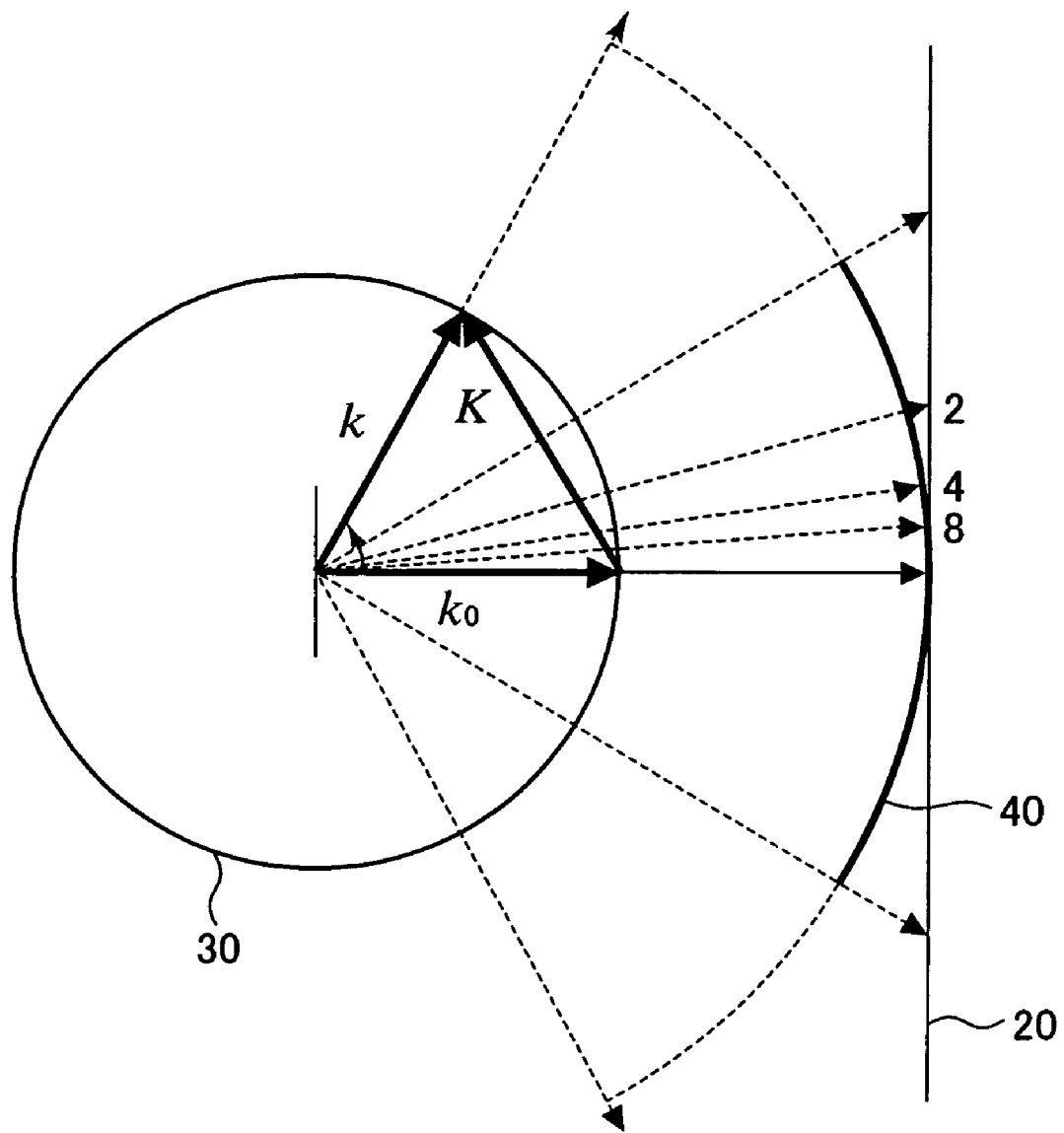
FIG. 7 shows an Ewald construction.

Measurement of diffraction intensity due to fine detector 330 is measurement in reciprocal space. FIG. 7 is an Ewald construction showing diffraction phenomena due to plane waves of a single wavelength. When wave number vectors of the incident wave and scattered wave are $k_0$ and k, respectively, the scattered vector can be expressed by $K=k_0-k$. The detector normally assumes a plane, and therefore, FIG. 7 shows plane-shaped detector 20 at a right end. Each of the reference numerals 2, 4 and 8 assigned to detector 20 respectively show the resolution based on the wavelength unit. Namely, reference numeral 2 shows the resolution corresponding to two wavelengths, reference numeral 4 shows the resolution corresponding to four wavelengths, and reference numeral 8 shows the resolution corresponding to eight wavelengths. As a result, it can be understood that if the resolution increases, it is necessary to measure wide angle diffraction intensity. However, at plane-shaped detector 20, diffracted waves enter at an angle in accordance with widening of the angle. This causes errors. The wide angle region decides the finally obtained spatial resolution, and therefore errors in measurement strongly influence the spatial resolution.

In this embodiment, in order to eliminate detection errors on the wide angle side and carry out ideal measurement of diffraction intensity, fine detector 330 is configured with spherical two-dimensional detector (Ewald sphere detector) 40 along Ewald sphere 30. As a result, it is possible to obtain spatial resolution of wavelength order.

Further, an intense incident beam collides with the center of the detector of the detection system, and therefore saturation occurs, and intensity cannot be measured. Therefore, a beam stopper is generally arranged in the front of the detector. However, in actual experiments, there are influences due to scattering by the beam stopper. The way of arrangement of the beam stopper is therefore a material problem in the experiments.

In this embodiment, hole 332 is formed (two-dimensional detector with center hole) at the center of fine detector (Ewald sphere detector) 330. If there is hole 332 at the center of fine detector 330, the incident beam passes through as is, and it is possible to avoid negative influence on the intensity measurement of the diffracted waves in the case of using the beam stopper. Further, by providing hole 332 at the center, the advantage can be obtained that it is not necessary to move fine detector 330 upon switching between coarse system measurement and fine system measurement.

FIG. 8 shows an example of a spherical two-dimensional detector having a hole at a center as fine detector 330, where FIG. 8A shows an example of an integrated type detector, and FIG. 8B shows an example of a split detector made up of four portions. By dividing the detector as shown in FIG. 8B, parallel processing of data is possible. The number of divisions for the divided detector is by no means limited to four.

When a certain amount of detection error is permitted on the wide-angle side, for example, when resolution can be confined to ten times of the wavelength, a plane-shaped detector can be substituted for the fine detector. FIG. 9 shows an example of plane-shaped integrated fine detector 340. Hole 332 is also formed at the center of plane-shaped fine detector 340.

Further, as described above, there are two two-dimensional detectors with center holes, a spherical shaped detector and a plane shaped detector, and both detectors can be configured with, for example, an imaging plate (IP) or CCD, or fiber CCD.

Further, detection errors on the wide-angle side are permitted to some extent, and therefore coarse detector 320 is configured with plane-shaped detector 20.

Figure 10:
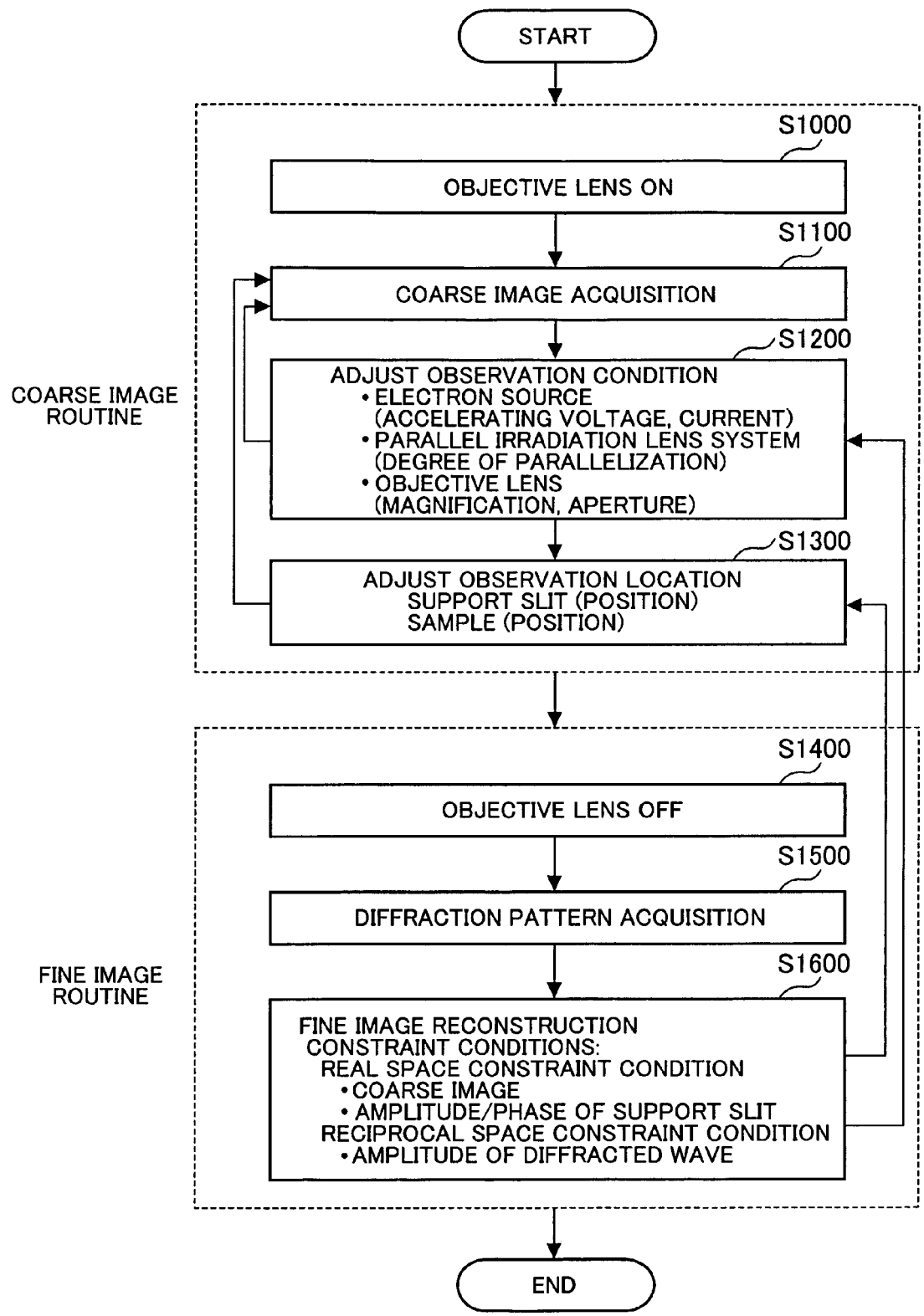
FIG. 10 is a flowchart showing a procedure for obtaining high-resolution images using the electron microscope of FIG. 2.

Next, a specific procedure (method) for obtaining a high-resolution image using electron microscope 10 having the above-described configuration will be described using the flowchart shown in FIG. 10.

In electron microscope 10 in FIG. 2, an electron beam emitted from electron source 110 is formed into a parallel beam by parallel irradiation lens system 120, passes through support slit 210, and enters sample 220. At this time, the procedure for obtaining a high-resolution image using electron microscope 10 is roughly classified into (1) acquiring a coarse image using the coarse system (step S1000 to step S1300), and (2) reconstructing a fine image using a phase retrieval algorithm by the fine system (step S1400 to step S1600). The former is a process for acquiring a coarse real image of low resolution (hereinafter referred to as "coarse image") using objective lens 310, and the latter is a process (hereinafter referred to as "fine image routine") for reconstructing a high-resolution real image (hereinafter referred to as "fine image") by a phase retrieval algorithm using the coarse image obtained by the coarse image routine as real space constraint conditions.

First, an outline of each of the routines (1) and (2) will be described.

In the coarse image routine, an incident electron beam is scattered by sample 220 and, first, focused by objective lens 310 of an excited (on) state. A real image is then formed by coarse detector 320, and digital data of the real image is acquired at computer 410. Here, the electron beam focused by objective lens 310 is small enough to pass through center hole 332 of fine detector 330, and therefore fine detector 330 does not influence coarse detector 320 that acquires the image of the coarse system.

Next, in the fine image routine, excitation of objective lens 310 is turned off (off state), and a diffracted image from sample 220 is acquired at fine detector 330. A high-resolution real image is obtained by calculation at computer 410 by applying the phase retrieval method using the coarse image obtained by coarse detector 320 and the amplitude (zero)/phase (acquired in advance) of the support region by the support slit as real space constraint conditions, and using the intensity of the diffracted image obtained by fine detector 330 as reciprocal space constraint conditions.

In this embodiment, objective lens 310 is turned on by the coarse image routine and a coarse image is acquired. As a result, a coarse real image (coarse image) of low resolution can be obtained. Next, objective lens 310 is turned off by the fine image routine, a diffraction pattern is acquired, and a fine image is reconstructed by computer 410 using the coarse image and the diffraction pattern. The fine image is a finer real image that corresponds to an ideal diffraction pattern and has higher spatial resolution than the coarse image.

With regards to this point, conventionally, a real image and a diffraction pattern are acquired with the objective lens remaining on. Because of this, in addition to the real image, a diffraction pattern that is also subject to the influence of lens aberrations (lens imperfections) is used in phase retrieval, and an ideal aplanatic diffraction pattern is not used in phase retrieval. This is because conventionally, the electron microscope apparatus is designed assuming that a diffraction pattern is acquired on the back focal plane of the objective lens.

In order to obtain a diffraction pattern that is not subject to the influence of lens aberrations, a dedicated apparatus for phase retrieval is necessary that is capable of readily obtaining a real image for extracting the desired observation region of the sample by turning the objective lens on, and acquiring a diffraction pattern by turning the objective lens off.

A real image of the sample using the objective lens becomes an image of low resolution because of aberrations of the objective lens. In this specification, a real image obtained by the objective lens is referred to as a coarse image (rough image). A real image obtained by the phase retrieval method using the coarse image and a diffraction pattern from the same region without using an objective lens is referred to as a fine image (fine spun image).

In this embodiment, the above-described series of operations are carried out automatically by a feedback loop. Feedback can be applied to turning objective lens 310 on and off, data acquisition from coarse detector 320 and fine detector 330, alignment of the position of electron source 110 (adjustment of accelerating voltage/current), parallel irradiation lens system 220 (adjustment of the degree of parallelization) and support slit 210 based on application of the phase retrieval method, adjustment of the position of sample 220, adjustment of magnification/aperture of objective lens 310, movement of fine detector 330 and adjustment of the center lens system. Adjustment for increasing spatial resolution is carried out using this kind of feedback.

In this embodiment, before sample 220 is arranged and each of the routines of (1) and (2) is executed, each of the routines of (1) and (2) is executed in advance without sample 220 being arranged, so as to obtain data for phase and amplitude with respect to support slit 210 as real space constraint conditions.

The specific procedure for each routine is as follows.

First, in step S1000, objective lens 310 is turned on (ON) for the coarse image routine. Namely, excitation of objective lens 310 is turned on.

Figure 11:
FIG. 11 is a photograph showing an example of a coarse image obtained using a coarse image routine of FIG. 10.

Then, in step S1100, a coarse image is acquired. Namely, a coarse image is acquired by coarse detector 320. FIG. 11 is a photograph showing an example of the acquired coarse image.

In step S1200, observation conditions are adjusted. Namely, based on the taken real image, as observation conditions, the accelerating voltage/current etc. of electron source 110, the degree of parallelization/aperture/light axis/scanning region (in the case of STEM (Scanning Transmission Electron Microscope) mode) etc. of parallel irradiation lens system 120, and the magnification/aperture etc. of objective lens 310 are adjusted. If adjustment is insufficient, processing is returned to step S100 in order to acquire a coarse image again. Here, whether or not adjustment is insufficient is determined by whether or not the coarse image acquired in step S1100 has predetermined spatial resolution.

Here, "STEM mode" is a mode of scanning sample 220 with a narrowed incident beam, and constructing a real image based on the signal of coarse detector 320 in synchronization with scanning. The principle is that, when the incident beam collides, scattered waves are outputted, and its intensity is measured by a detector, and, during this time, an image can be obtained by scanning the incident beam on the sample and synchronizing the measured data with the incident beam.

In step S1300, the observation location is adjusted. Namely, the observation location is adjusted by moving the position of support slit 210 and sample 220. If adjustment is insufficient, processing is returned to step S1100 in order to acquire a coarse image again. Here, whether or not adjustment is insufficient is determined by whether or not an observation target exists in a desired location in the coarse image acquired in step S1100.

The coarse image finally obtained in step S1100 is then taken in computer 410 and stored as digital data.

The processing of step S1100 and step S1200 (acquisition of a coarse image after adjustment of observation conditions using feedback) and the processing of step S1100 and step S1300 (acquisition of a coarse image after adjustment of the observation location using feedback) can be respectively executed in real time.

Next, in step S1400, objective lens 310 is turned off (OFF) for the fine image routine. Namely, excitation of objective lens 310 is turned off.

Figure 12:
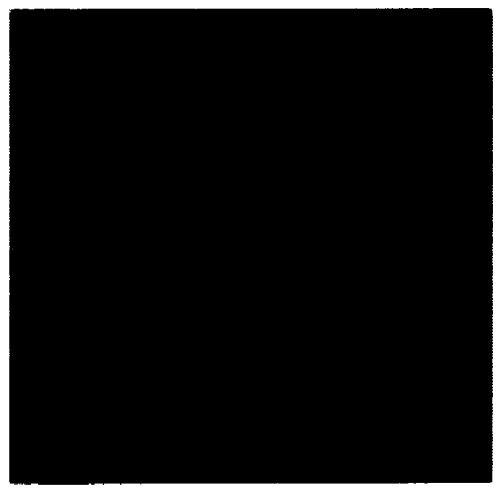
FIG. 12 is a photograph showing an example of a diffraction pattern obtained using a fine image routine of FIG. 10.

Then, in step S1500, a diffraction pattern is acquired. Namely, a diffraction pattern is taken in computer 410 via fine detector 330. FIG. 12 is a photograph showing an example of an acquired diffraction pattern.

Figure 13:
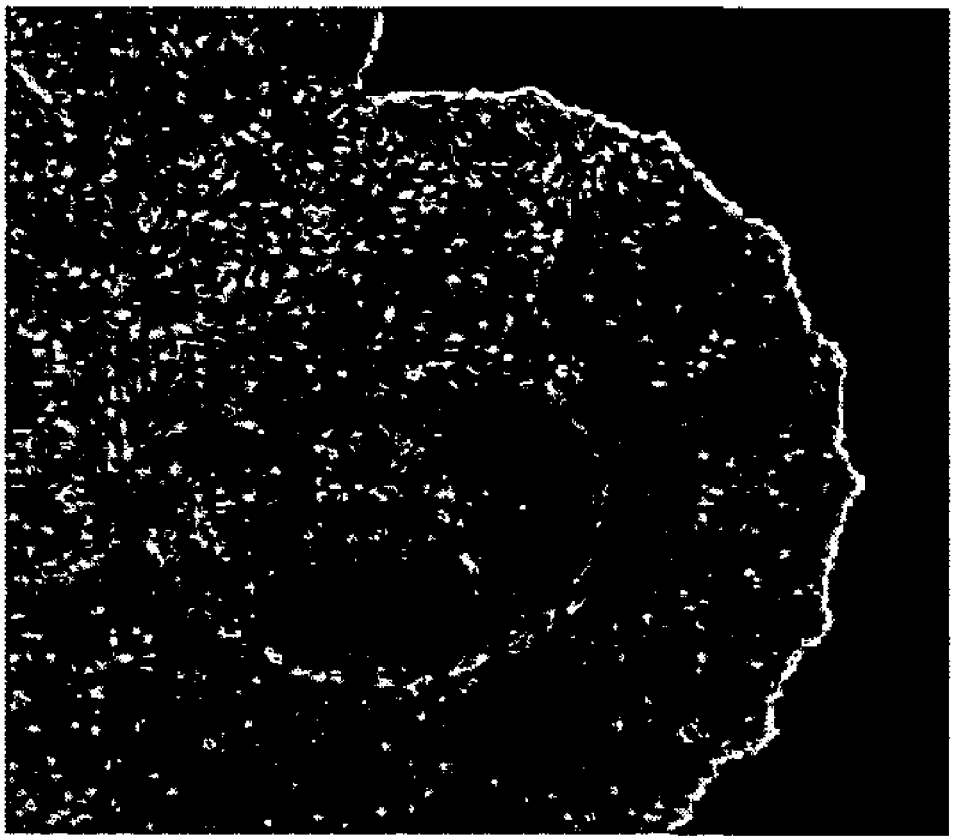
FIG. 13 shows an example of a fine image reconstructed using the fine image routine of FIG. 10.

In step S1600, a fine image is reconstructed. Namely, a real image (fine image) is obtained by the phase retrieval method shown in FIG. 4 using the coarse image (refer to FIG. 11) obtained by the coarse image-routine of step S1000 to step S1300 and the phase/amplitude of support slit 210 acquired in advance as real space constraint conditions, and using the amplitude of the diffracted wave calculated from the diffraction pattern (refer to FIG. 12) obtained by acquiring the diffraction pattern in step S1500 as reciprocal space constraint conditions. Adjustment of the observation conditions of step S1200 and feedback for the adjustment of the observation location of step S1300 is carried out based on the obtained fine image. A fine image having the desired high resolution is then reconstructed by repeating the coarse image routine and the fine image routine. Here, as described above, the phase and amplitude of support slit 210 acquired in advance are the phase and amplitude with respect to support slit 210 obtained using the procedures of the above-described routines in a state of only support slit 210 (no sample). FIG. 13 shows an example of a reconstructed fine image.

Here, examples of real space constraint conditions and reciprocal space constraint conditions are shown. Real space constraint conditions are provided by the following equation.

$$\text{Amplitude } |f'| = \begin{cases} |f| & r \in s \\ 0 & r \notin s \end{cases} \quad (5)$$

Here, s indicates within support. Namely, here, amplitude of outside of the support is zero, and amplitude subjected to inverse Fourier transform is used as is within the support.

$$\text{Phase: } \phi' = \begin{cases} \phi & r \in s \\ \phi_{sl} & r \notin s \end{cases} \quad (6)$$

Here, $\phi_{s1}$ is a phase of outside of support slit 210, and obtained in advance in a state with no sample.

Further, reciprocal space constraint conditions are provided by the following equation.

$$\text{Amplitude: } |F'| = |F| \quad (7)$$

This is the amplitude calculated from the intensity measured at fine detector 330.

Figure 14:
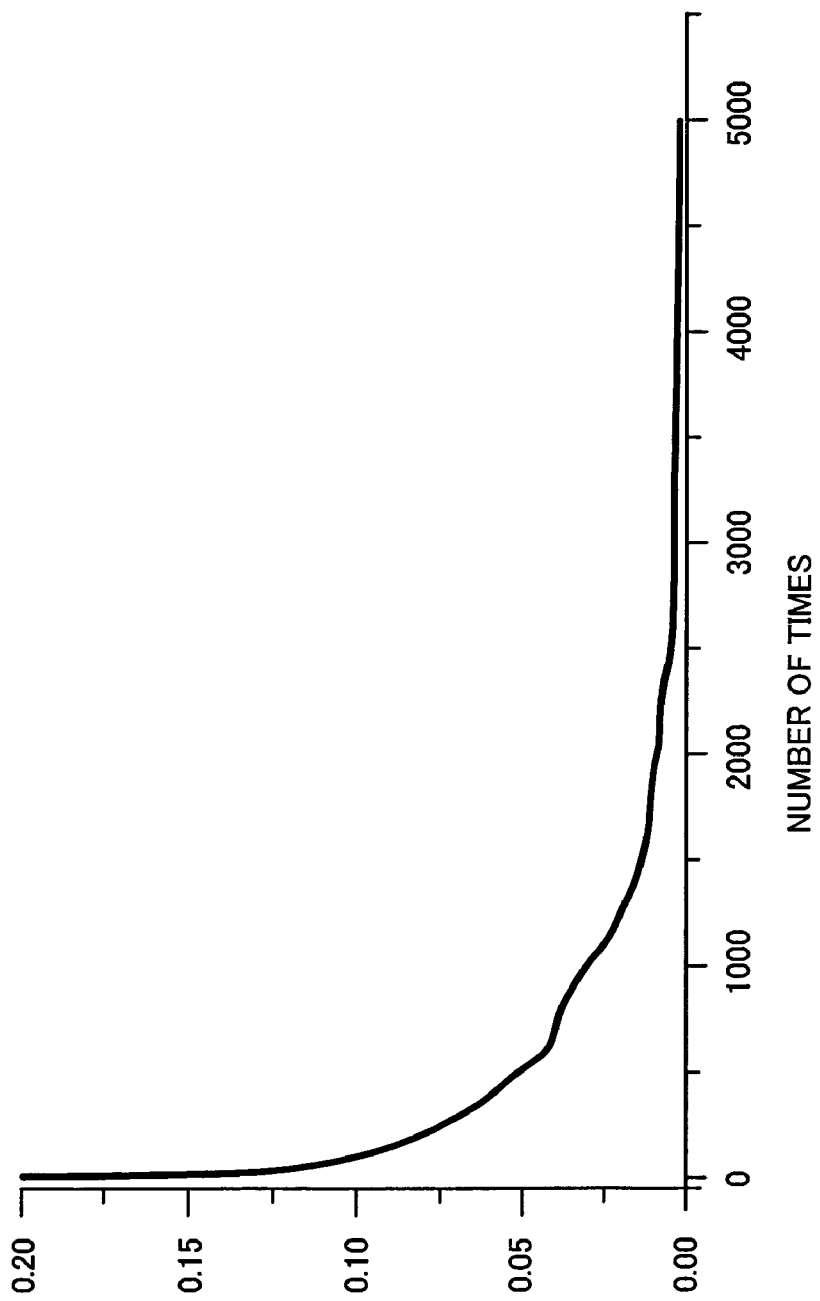
FIG. 14 is a graph showing processes carrying out the reconstruction of the fine image using the fine image routine of FIG. 10.

FIG. 14 is a graph showing the process of reconstructing a fine image by computer 410 using the coarse image and the diffraction pattern. The graph in FIG. 14 takes the number of repetitions (refer to FIG. 3) as a horizontal axis, and the error (refer to equation 3) as a vertical axis. As shown in FIG. 14, the error reliably decreases in accordance with an increase of the number of repetitions. FIG. 15A, FIG. 15B, FIG. 15C and FIG. 15D show examples of real images where the number of repetitions is 10 times, 100 times, 1000 times and 5000 times, respectively. According to FIG. 15A to FIG. 15D, it can be understood that the real image can be reliably reconstructed in accordance with an increase of the number.

By carrying out the feedback described above at high speed, it is possible to carry out automatic processing to conditions set in advance, and tracking of dynamic phenomena (automatic tracking).

According to this embodiment, data relating to phase (for example, coarse image phase, phase of support slit 210), in addition to data relating to amplitude (for example, coarse image amplitude, amplitude of support slit 210, amplitude of diffracted waves for the fine system) as constraint conditions in the phase retrieval method is used, so that it is possible to add more constraint conditions of different types, and effectively apply the phase retrieval method to the electron microscope. Therefore, it is possible to achieve high resolution according to the principle of the phase retrieval method.

Further, a fine image is acquired (reconstructed) by a computer using a coarse image and a diffraction pattern by dividing the detection system into a coarse system and fine system, turning the objective lens electrically on and off without changing an incident beam system (irradiating beam system), and in particular, at the fine system, turning objective lens 310 electrically off, that is, implementing a lens function using computer 410 without requiring a physical objective lens, so that it is possible to implement an electron microscope having high spatial resolution without any influence from lens aberrations even in cases where the performance of a physical lens is poor or the manufacture of a high-performance physical lens is difficult. As a result, it is possible to provide a new specific apparatus configuration method of high resolution that is completely different from high resolution of the conventional electron microscopes.

In this embodiment, coarse detector 320 is provided in order to acquire a coarse image, but the method of acquiring a coarse image is by no means limited. For example, if the STEM mode is actively used, it is possible to acquire a coarse image using a detector for a fine system. As described above, this is because it is possible to obtain an image by scanning an incident beam on the sample and synchronizing the measured data with the incident beam. Namely, hardware of the fine system can be substituted for the coarse system obtaining the coarse image.

Further, in STEM mode, a two-dimensional detector is fitted, and an SEM (Scanning Electron Microscope) image is normally acquired. In this case, the surface shape acquired using the SEM image can be used as constraint conditions in real space.

Further, it is necessary for the waves incident to the sample to be coherent for application of the phase retrieval method. Therefore, high coherence of the incident beam is strictly required for electron microscopes. It is necessary to detect interference of the incident beam in order to implement high coherence of the incident beam. Interference can be evaluated by measuring phase of a wave surface. The present inventor applies the phase retrieval method and devises a way of readily measuring phase of the wave surface of the electron beam. Namely, the phase distribution of the incident beam within a pinhole can be obtained by the phase retrieval method using a sample as the pinhole, phase shift is obtained from a plane wave as a result, and interference of the incident beam can be evaluated as a result.

The present application is based on Japanese Patent Application No. 2004-150588 filed on May 20, 2004, entire content of which is expressly incorporated by reference herein.

INDUSTRIAL APPLICABILITY

The electron microscope method and electron microscope employing this method of the present invention are useful as an electron microscope method and electron microscope employing this method for implementing high-resolution according to the principle of the phase retrieval method.

The invention claimed is:

1. An electron microscope method that irradiates a sample with an electron beam, measures intensity of a diffracted wave from the sample, and reconstructs an image of an object using the phase retrieval method based on measured intensity of the diffracted wave, comprising the steps of:
    acquiring a coarse image of comparatively low spatial resolution; and
    acquiring a fine image of higher spatial resolution by the phase retrieval method using the intensity of the diffracted wave, without using a physical objective lens.

2. The electron microscope method according to claim 1, wherein the coarse image is acquired without using the objective lens.

3. The electron microscope method according to claim 1, wherein the coarse image is acquired using an objective lens.

4. The electron microscope method according to claim 3, wherein:
    the objective lens is an objective lens capable of being turned on and off electrically;
    the step of acquiring the coarse image turns on the objective lens electrically and acquires the coarse image; and
    the step of acquiring the fine image comprises a step of turning off the objective lens electrically and acquiring a diffraction pattern from the same region as the coarse image.

5. The electron microscope method according to claim 2, wherein the step of acquiring the fine image further comprises a step of reconstructing the fine image by the phase retrieval method using the coarse image acquired in the step of acquiring the coarse image and the diffraction pattern acquired in the step of acquiring the diffraction pattern.

6. The electron microscope method according to claim 5, wherein the step of reconstructing the fine image uses the coarse image as an initial image in the phase retrieval method.

7. The electron microscope method according to claim 1, wherein data relating to phase is used in addition to data relating to amplitude as a constraint condition in the phase retrieval method.

8. The electron microscope method according to claim 7, wherein the data relating to phase is phase distribution of a support slit arranged in the front of the sample with respect to an irradiation direction of the electron beam.

9. The electron microscope method according to claim 7, wherein data obtained from at least one of an incident system, a sample system, a detection system and a computer system configuring an electron microscope is used as a real space constraint condition in the phase retrieval method.

10. The electron microscope method 9, wherein:
    the detection system comprises:
        a coarse system for obtaining an image of comparatively low spatial resolution; and
        a fine system for obtaining higher spatial resolution by the phase retrieval method using the intensity of the diffracted wave, without using the objective lens; and
    the detection system uses data obtained by the coarse system as a real space constraint condition in the phase retrieval method, and uses data obtained by the fine system as an reciprocal space constraint condition in the phase retrieval method.

11. The electron microscope method according to claim 9, wherein:
    the detection system comprises a fine system for obtaining an image of comparatively high spatial resolution by the phase retrieval method using the intensity of the diffracted wave, without using the objective lens; and the detection system obtains an image of comparatively low spatial resolution by a detector of the fine system using STEM mode.

12. The electron microscope method according to claim 9, wherein:
the detection system comprises a secondary electron detector for obtaining an SEM image; and
the detection system uses a surface shape obtained by the SEM image as a real space constraint condition in the phase retrieval method in the case of STEM mode.

13. An electron microscope that irradiates a sample with an electron beam, measures intensity of a diffracted wave from the sample, and reconstructs an image of an object using the phase retrieval method based on measured intensity of the diffracted wave, the electron microscope comprising:
a section that acquires a coarse image of comparatively low spatial resolution; and
a section that acquires a fine image of higher spatial resolution by the phase retrieval method using the intensity of the diffracted wave, without using a physical objective lens.

14. The electron microscope according to claim 13, wherein the coarse image is acquired without using an objective lens.

15. The electron microscope according to claim 13, wherein the coarse image is acquired using an objective lens.

16. The electron microscope according to claim 15, wherein:
the objective lens is an objective lens capable of being turned on and off electrically;
the section that acquires the coarse image turns on the objective lens electrically and acquires the coarse image; and
the section that acquires the fine image comprises a section that turns off the objective lens electrically and acquires a diffraction pattern from the same region as the coarse image.

17. The electron microscope according to claim 16, wherein the section that acquires the fine image further comprises a section that reconstructs the fine image by the phase retrieval method using the coarse image acquired by the section that acquires the coarse image and the diffraction pattern acquired by the section that acquires the diffraction pattern.

18. The electron microscope according to claim 17, wherein the section that reconstructs the fine image uses the coarse image as an initial image in the phase retrieval method.

19. The electron microscope according to claim 13, further comprising:
an incident system that irradiates a sample with a parallel electron beam;
a sample system that fixes the sample and controls an environment of the sample;
a detection system that measures intensity of a diffracted wave from the sample; and
a computer system that reconstructs an image of an object using the phase retrieval method based on intensity of the diffracted wave measured by the detection system,
wherein data relating to phase is used in addition to data relating to amplitude as a constraint condition in the phase retrieval method.

20. The electron microscope according to claim 19, wherein the data relating to phase is phase distribution of a support slit arranged in the front of the sample with respect to an irradiation direction of the electron beam.

21. The electron microscope according to claim 20, wherein the detector configuring the fine system is a spherical two-dimensional detector.

22. The electron microscope according to claim 20, wherein the detector configuring the fine system has a hole formed at the center.

23. The electron microscope according to claim 20, wherein at least one of the incident system, sample system and detection system performs feedback control based on image data obtained from the coarse system so that an observation condition and/or an observation location is/are adjusted to an optimum state.

24. The electron microscope according to claim 23, wherein the fine system is made to operate after the coarse system is made to operate.

25. The electron microscope according to claim 20, wherein at least one of the incident system, sample system and detection system performs feedback control based on image data obtained from the fine system so that an observation condition and/or an observation location is/are adjusted to an optimum state.

26. The electron microscope according to claim 20, wherein the physical lens is an objective lens, and the coarse system and the fine system are switched by turning the objective lens on and off.

27. The electron microscope according to claim 19, wherein data obtained from at least one of the incident system, the sample system and the detection system is used as a real space constraint condition in the phase retrieval method.

28. The electron microscope according to claim 27, wherein the spherical two-dimensional detector is configured with a plurality of portions capable of processing independently.

29. The electron microscope according to claim 19, wherein:
the detection system comprises:
a coarse system for obtaining an image of comparatively low spatial resolution; and
a fine system for obtaining higher spatial resolution by the phase retrieval method using the intensity of the diffracted wave, without using the objective lens; and
the detection system uses data obtained by the coarse system as a real space constraint condition in the phase retrieval method, and uses data obtained by the fine system as reciprocal space constraint condition in the phase retrieval method.

30. The electron microscope according to claim 19, wherein:
the detection system comprises a fine system for obtaining an image of comparatively high spatial resolution by the phase retrieval method using the intensity of the diffracted wave, without using the objective lens; and
the detection system obtains an image of comparatively low spatial resolution by a detector of the fine system using STEM mode.

31. The electron microscope according to claim 19, wherein:
the detection system comprises a secondary electron detector for obtaining an SEM image; and
the detection system uses a surface shape obtained by the SEM image as a real space constraint condition in the phase retrieval method in the case of STEM mode.

* * * * *